United States Patent
Kobayashi et al.

(10) Patent No.: US 12,107,159 B2
(45) Date of Patent: Oct. 1, 2024

(54) SEMICONDUCTOR DEVICE

(71) Applicants: KABUSHIKI KAISHA TOSHIBA, Tokyo (JP); TOSHIBA ELECTRONIC DEVICES & STORAGE CORPORATION, Tokyo (JP)

(72) Inventors: Yusuke Kobayashi, Nagareyama (JP); Tomoaki Inokuchi, Yokohama (JP); Hiro Gangi, Ota (JP); Hiroki Nemoto, Fuchu (JP); Akihiro Goryu, Kanazawa (JP); Ryohei Gejo, Kawasaki (JP); Tsuyoshi Kachi, Kanazawa (JP); Tatsuya Nishiwaki, Komatsu (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 307 days.

(21) Appl. No.: 17/395,890

(22) Filed: Aug. 6, 2021

(65) Prior Publication Data

US 2022/0293785 A1     Sep. 15, 2022

(30) Foreign Application Priority Data

Mar. 9, 2021   (JP) ................. 2021-036912

(51) Int. Cl.
*H01L 21/82*      (2006.01)
*H01L 27/00*      (2006.01)
(Continued)

(52) U.S. Cl.
CPC ...... *H01L 29/7812* (2013.01); *H01L 29/0657* (2013.01); *H01L 29/165* (2013.01);
(Continued)

(58) Field of Classification Search
CPC .............. H01L 29/407; H01L 29/7813; H01L 21/823487; H01L 27/0825; H01L 27/0828
See application file for complete search history.

(56) References Cited

U.S. PATENT DOCUMENTS 8,198,678 B2   6/2012  Mauder et al.
9,691,846 B2   6/2017  Oka et al.
(Continued)

FOREIGN PATENT DOCUMENTS

JP    2007-194283 A    8/2007
JP    2014-078741 A    5/2014
(Continued)

OTHER PUBLICATIONS

Eyben, P. et al. "Progress towards a physical contact model for scanning spreading resistance microscopy", Materials Science and Engineering B102, (2003) pp. 132-137.

*Primary Examiner* — Vu A Vu
*Assistant Examiner* — Valerie N Newton
(74) *Attorney, Agent, or Firm* — Oblon, McClelland, Maier & Neustadt, L.L.P.

(57) ABSTRACT

According to one embodiment, a semiconductor device includes first to third electrodes, a conductive member, a semiconductor member, and an insulating member. The conductive member includes a conductive member end portion and a conductive member other-end portion. The conductive member end portion is between the first electrode and the conductive member other-end portion. The conductive member is electrically connected with one of the second electrode or the third electrode. The semiconductor member includes first to third semiconductor regions. The first semiconductor region includes first and second partial regions. The first partial region is between the first and second electrodes. The second semiconductor region is between the first partial region and the third semiconductor (Continued)

region. The third semiconductor region is electrically connected with the second electrode. A portion of the insulating member is between the semiconductor member and the third electrode and between the semiconductor member and the conductive member.

18 Claims, 6 Drawing Sheets

(51) Int. Cl.
  *H01L 29/06* (2006.01)
  *H01L 29/165* (2006.01)
  *H01L 29/40* (2006.01)
  *H01L 29/423* (2006.01)
  *H01L 29/78* (2006.01)
(52) U.S. Cl.
  CPC ...... *H01L 29/407* (2013.01); *H01L 29/42364* (2013.01); *H01L 29/7813* (2013.01)

(56) References Cited

U.S. PATENT DOCUMENTS

| | | |
|---|---|---|
| 2007/0187695 A1 | 8/2007 | Nakamura et al. |
| 2016/0087064 A1 | 3/2016 | Ohashi et al. |
| 2016/0322489 A1* | 11/2016 | Siemieniec ........... H01L 29/513 |
| 2019/0097045 A1* | 3/2019 | Grote ................ H01L 29/66666 |
| 2019/0280112 A1* | 9/2019 | Shimizu ................ H01L 29/205 |
| 2020/0058778 A1 | 2/2020 | Fukunaga et al. |
| 2020/0295150 A1* | 9/2020 | Nishiwaki ......... H01L 29/66727 |

FOREIGN PATENT DOCUMENTS

| | | |
|---|---|---|
| JP | 2016-066641 A | 4/2016 |
| JP | 2016-111253 A | 6/2016 |
| WO | WO 2018/078775 A1 | 5/2018 |

* cited by examiner

SEMICONDUCTOR DEVICE

CROSS-REFERENCE TO RELATED APPLICATIONS

This application is based upon and claims the benefit of priority from Japanese Patent Application No. 2021-036912, filed on Mar. 9, 2021; the entire contents of which are incorporated herein by reference.

FIELD

Embodiments described herein relate generally to a semiconductor device.

BACKGROUND

For example, it is desirable to improve the characteristics of a semiconductor device such as a transistor or the like.

DETAILED DESCRIPTION

According to one embodiment, a semiconductor device includes a first electrode, a second electrode, a third electrode, a first conductive member, a semiconductor member, and a first insulating member. A direction from the first electrode toward the second electrode is along a first direction. The first conductive member includes a first conductive member end portion and a first conductive member other-end portion. The first conductive member end portion is between the first electrode and the first conductive member other-end portion in the first direction. A position in the first direction of the first conductive member end portion is between a position in the first direction of the first electrode and a position in the first direction of the third electrode. The first conductive member is electrically connected with one of the second electrode or the third electrode or being electrically connectable with the one of the second electrode or the third electrode. The semiconductor member includes a first semiconductor region of a first conductivity type, a second semiconductor region of a second conductivity type, and a third semiconductor region of the first conductivity type. The first semiconductor region includes a first partial region and a second partial region. The first partial region is between the first electrode and the second electrode in the first direction. The second semiconductor region is between the first partial region and the third semiconductor region in the first direction. The third semiconductor region is electrically connected with the second electrode. A second direction from a portion of the third electrode toward the second semiconductor region crosses the first direction. A direction from an other portion of the third electrode toward a portion of the first partial region is along the second direction. A direction from the second partial region toward the first conductive member is along the first direction. A direction from the first conductive member toward the first partial region is along the second direction. At least a portion of the first insulating member is between the semiconductor member and the third electrode and between the semiconductor member and the first conductive member. At least a portion of the first insulating member includes silicon, oxygen, and a first element. The first element includes at least one selected from the group consisting of hydrogen, helium, argon, and carbon. The first insulating member includes a first position, a second position, and a third position. A direction from the first conductive member end portion toward the first position is along the second direction. The first position is between the first electrode and the second position in the first direction. The third position is between the first position and the second position in the first direction. A third concentration of the first element at the third position is greater than a first concentration of the first element at the first position and greater than a second concentration of the first element at the second position.

According to one embodiment, a semiconductor device includes a first electrode, a second electrode, a third electrode, a first conductive member, a semiconductor member, and a first insulating member. A direction from the first electrode toward the second electrode is along a first direction. The first conductive member includes a first conductive member end portion and a first conductive member other-end portion. The first conductive member end portion is between the first electrode and the first conductive member other-end portion in the first direction. A position in the first direction of the first conductive member end portion is between a position in the first direction of the first electrode and a position in the first direction of the third electrode. The first conductive member is electrically connected with one of the second electrode or the third electrode or being electrically connectable with the one of the second electrode or the third electrode. The semiconductor member includes a first semiconductor region of a first conductivity type, a second semiconductor region of a second conductivity type, and a third semiconductor region of the first conductivity type. The first semiconductor region includes a first partial region and a second partial region. The first partial region is between the first electrode and the second electrode in the first direction. The second semiconductor region is between the first partial region and the third semiconductor region in the first direction. The third semiconductor region is electrically connected with the second electrode. A second direction from a portion of the third electrode toward the second semiconductor region crosses the first direction. A direction from an other portion of the third electrode toward a portion of the first partial region is along the second direction. A direction from the second partial region toward the first conductive member is along the first direction. A direction from the first conductive member toward the first partial region is along the second direction. The first insulating member includes a first position, a second position, and a third position. A direction from the first conductive member end portion toward the first position is along the second direction. The first position is between the first electrode and the second position in the first direction. The third position is between the first position and the second position in the first direction. A third potential at the third position is greater than a first potential at the first position and greater than a second potential at the second position.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

First Embodiment

Figure 1:
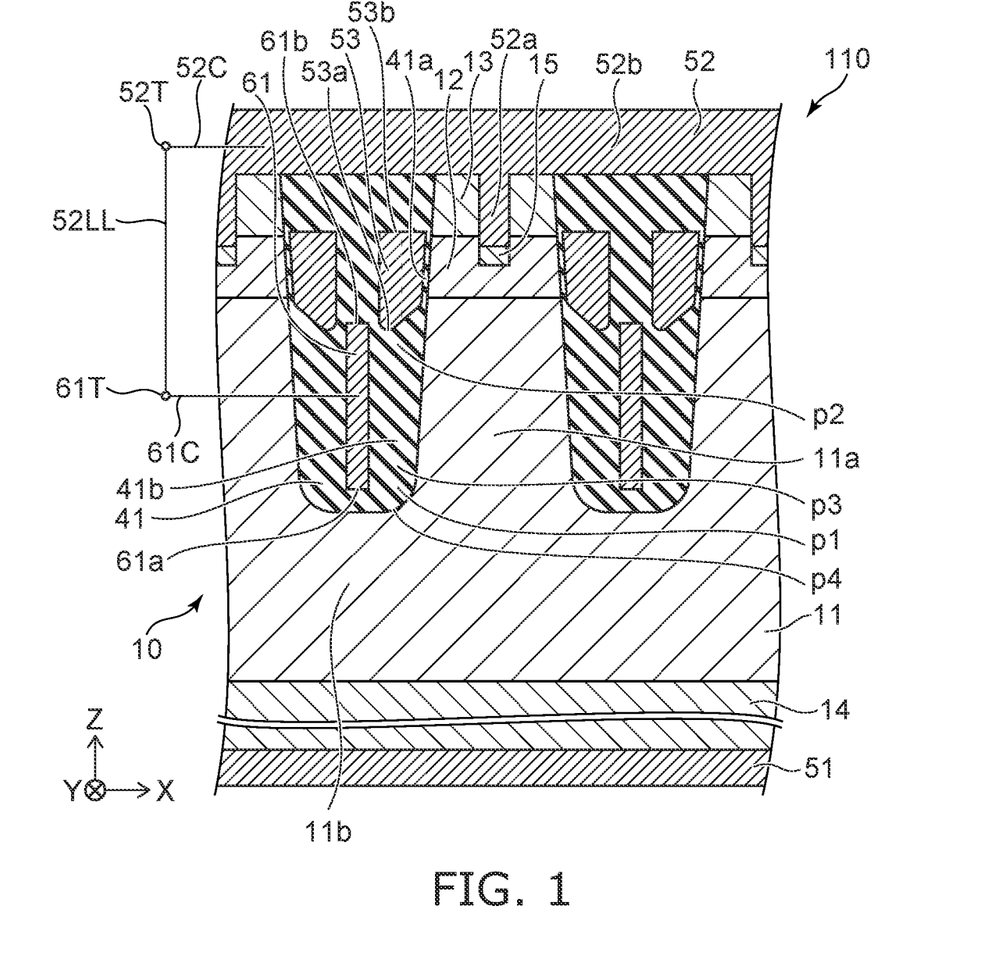
FIG. 1 is a schematic cross-sectional view illustrating a semiconductor device according to a first embodiment.
Figure 2:
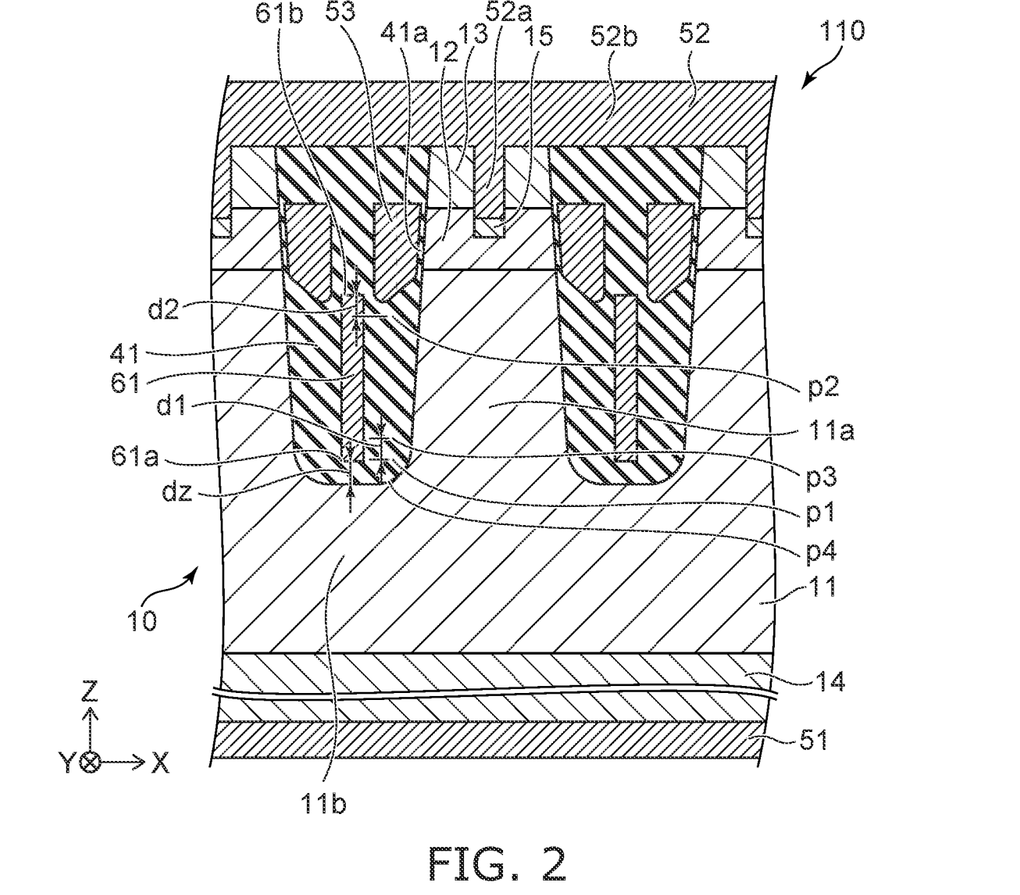
FIG. 2 is a schematic cross-sectional view illustrating the semiconductor device according to the first embodiment.

FIGS. 1 and 2 are schematic cross-sectional views illustrating a semiconductor device according to a first embodiment.

As shown in FIG. 1, the semiconductor device 110 according to the embodiment includes a first electrode 51, a second electrode 52, a third electrode 53, a first conductive member 61, a semiconductor member 10, and a first insulating member 41.

The direction from the first electrode 51 toward the second electrode 52 is along a first direction. The first direction is taken as a Z-axis direction. A direction perpendicular to the Z-axis direction is taken as an X-axis direction. A direction perpendicular to the Z-axis direction and the X-axis direction is taken as a Y-axis direction.

In one example, the position in the first direction (the Z-axis direction) of the third electrode 53 is between the position in the first direction of the first electrode 51 and the position in the first direction of the second electrode 52.

The first conductive member 61 includes a first conductive member end portion 61a and a first conductive member other-end portion 61b. The first conductive member end portion 61a and the first conductive member other-end portion 61b are Z-axis direction end portions. The first conductive member end portion 61a is between the first electrode 51 and the first conductive member other-end portion 61b in the first direction. The first conductive member end portion 61a is, for example, a lower end portion. The position in the first direction of the first conductive member end portion 61a is between the position in the first direction of the first electrode 51 and the position of the first direction of a third electrode end portion 53a.

In the example, the third electrode 53 includes a third electrode end portion 53a and a third electrode other-end portion 53b. The third electrode end portion 53a and the third electrode other-end portion 53b are Z-axis direction end portions. The third electrode end portion 53a is between the first electrode 51 and the third electrode other-end portion 53b in the first direction (the Z-axis direction). The third electrode end portion 53a is the end portion of the third electrode 53 at the first electrode 51 side. The third electrode end portion 53a is, for example, the lower end portion.

In the example, the position in the first direction (the Z-axis direction) of the first conductive member end portion 61a is between the position in the first direction of the first electrode 51 and the position in the first direction of the third electrode end portion 53a. In the example, the position in the first direction of the first conductive member other-end portion 61b is between the position in the first direction of the first electrode 51 and the position in the first direction of the third electrode other-end portion 53b. In the example, the position in the first direction of the first conductive member other-end portion 61b is between the position in the first direction of the third electrode end portion 53a and the position in the first direction of the third electrode other-end portion 53b. The first conductive member 61 extends along the Z-axis direction.

The first conductive member 61 is electrically connected with one of the second electrode 52 or the third electrode 53. Or, the first conductive member 61 is electrically connectable with one of the second electrode 52 or the third electrode 53. In the semiconductor device 110, the first conductive member 61 is electrically connected with the second electrode 52.

For example, as shown in FIG. 1, the first conductive member 61 is electrically connected with the second electrode 52 via a connection member 61C, a connection member 52LL, and a connection member 52C. These connection members may be located at a position that is different from the cross section illustrated in FIG. 1. For example, a terminal 52T may be connected with the second electrode 52 via the connection member 52C. A terminal 61T may be electrically connected with the first conductive member 61 via the connection member 61C. The terminal 61T may be electrically connected with the terminal 52T by the connection member 52LL. The connection member 52LL may be provided separately from the semiconductor device 110.

For example, the semiconductor member 10 is between the first electrode 51 and the second electrode 52. The semiconductor member 10 includes, for example, a semiconductor such as silicon, etc.

The semiconductor member 10 includes a first semiconductor region 11 of a first conductivity type, a second semiconductor region 12 of a second conductivity type, and a third semiconductor region 13 of the first conductivity type. As shown in FIG. 1, the semiconductor member 10 may further include a fourth semiconductor region 14. As shown in FIG. 1, the semiconductor member 10 may further include a fifth semiconductor region 15.

For example, the first conductivity type is an n-type; and the second conductivity type is a p-type. According to the embodiment, the first conductivity type may be the p-type; and the second conductivity type may be the n-type. In the following example, the first conductivity type is the n-type; and the second conductivity type is the p-type.

The first semiconductor region 11 includes a first partial region 11a and a second partial region 11b. For example, the first partial region 11a is between the first electrode 51 and the second electrode 52 in the first direction (the Z-axis direction).

The second semiconductor region 12 is between the first partial region 11a and the third semiconductor region 13 in the first direction (the Z-axis direction). For example, the first partial region 11a, the second semiconductor region 12, and the third semiconductor region 13 are between the first electrode 51 and the second electrode 52. The third semiconductor region 13 is electrically connected with the second electrode 52.

A second direction from a portion of the third electrode 53 toward the second semiconductor region 12 crosses the first direction. The second direction is, for example, the X-axis direction.

The direction from another portion of the third electrode 53 toward a portion of the first partial region 11a is along the second direction (e.g., the X-axis direction).

The direction from the second partial region 11b of the first semiconductor region 11 toward the first conductive member 61 is along the first direction (the Z-axis direction).

The direction from the first conductive member 61 toward the first partial region 11a is along the second direction (e.g., the X-axis direction).

The fourth semiconductor region 14 is located between the first electrode 51 and the first semiconductor region 11 in the first direction (the Z-axis direction). The fourth semiconductor region 14 is of the first conductivity type (e.g., the n-type). The fourth semiconductor region 14 is electrically connected with the first electrode 51. The fourth semiconductor region 14 may include, for example, a semiconductor substrate.

The first-conductivity-type carrier concentration in the fourth semiconductor region 14 is greater than the first-conductivity-type carrier concentration in the first semiconductor region 11. The first semiconductor region 11 is, for example, an n-region or an n⁻-region. The fourth semiconductor region 14 is, for example, an n⁺-region. By providing the fourth semiconductor region 14, the resistance of the electrical connection of the first electrode 51 can be reduced. For example, a low on-resistance is obtained.

The first-conductivity-type carrier concentration in the third semiconductor region 13 is greater than the first-conductivity-type carrier concentration in the first semiconductor region 11. The third semiconductor region 13 is, for example, an n⁺-region.

When the fifth semiconductor region 15 is provided, for example, the fifth semiconductor region 15 is located between the second semiconductor region 12 and the second electrode 52. The fifth semiconductor region 15 is of the second conductivity type (e.g., the p-type). The second-conductivity-type carrier concentration in the fifth semiconductor region 15 is greater than the second-conductivity-type carrier concentration in the second semiconductor region 12. For example, the second semiconductor region 12 is a p-region. The fifth semiconductor region 15 is a p⁺-region. By providing the fifth semiconductor region 15, the resistance of the electrical connection of the second electrode 52 can be reduced. For example, a low on-resistance is obtained.

In the example, the second electrode 52 includes a portion 52a and a portion 52b. The fifth semiconductor region 15 is between the second semiconductor region 12 and the portion 52a. The third electrode 53 is between the first electrode 51 and the portion 52b.

At least a portion of the first insulating member 41 is between the semiconductor member 10 and the third electrode 53 and between the semiconductor member 10 and the first conductive member 61. For example, the first insulating member 41 includes a first insulating region 41a and a second insulating region 41b. For example, the first insulating region 41a is between the third electrode 53 and the second semiconductor region 12 in the second direction (e.g., the X-axis direction). The second insulating region 41b is between the first conductive member 61 and the semiconductor member 10. In the example, a portion of the first insulating member 41 is between the third electrode 53 and the portion 52b.

For example, the current that flows between the first electrode 51 and the second electrode 52 can be controlled by the potential of the third electrode 53. The potential of the third electrode 53 is, for example, a potential that is referenced to the potential of the second electrode 52. For example, the first electrode 51 functions as a drain electrode. For example, the second electrode 52 functions as a source electrode. For example, the third electrode 53 functions as a gate electrode. For example, the first insulating region 41a functions as a gate insulating film. For example, the first conductive member 61 functions as a field plate. The semiconductor device 110 is, for example, a transistor.

According to the embodiment, at least a portion of the first insulating member 41 includes silicon, oxygen, and a first element. The first element includes at least one selected from the group consisting of hydrogen, helium, argon, and carbon. In one example, the first element is, for example, hydrogen or a proton.

As shown in FIG. 1, the first insulating member 41 includes a first position p1, a second position p2, and a third position p3. The direction from the first conductive member end portion 61a toward the first position p1 is along the second direction (e.g., the X-axis direction). The position (e.g., the depth) in the Z-axis direction of the first position p1 corresponds to the depth of the lower end of the first conductive member 61.

The first position p1 is between the first electrode 51 and the second position p2 in the first direction (the Z-axis direction). The second position p2 is higher than the first position p1. For example, the distance along the Z-axis direction between the second position p2 and the first conductive member other-end portion 61b is less than the distance along the Z-axis direction between the second position p2 and the first conductive member end portion 61a.

The third position p3 is between the first position p1 and the second position p2 in the first direction (the Z-axis direction). According to the embodiment, the concentration of the first element is different between these positions. The concentration of the first element changes along the Z-axis direction.

An example of a profile of the concentration of the first element will now be described.

Figure 3:
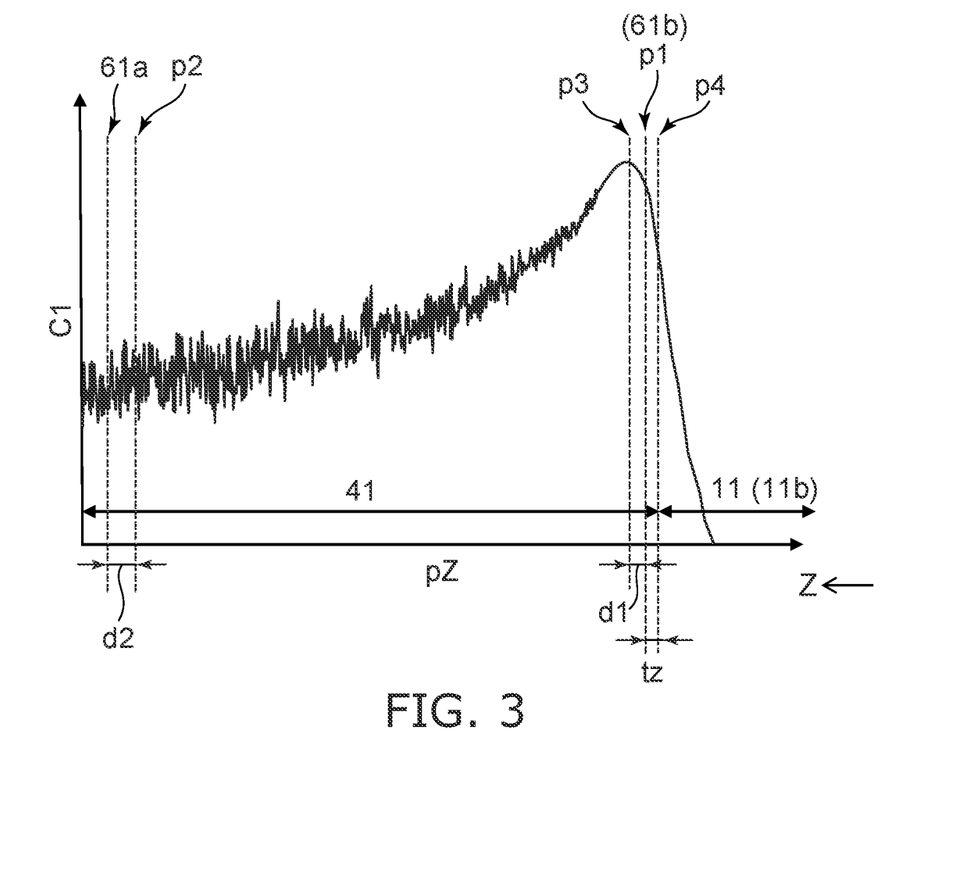
FIG. 3 is a graph illustrating the semiconductor device according to the first embodiment.

FIG. 3 is a graph illustrating the semiconductor device according to the first embodiment.

FIG. 3 illustrates the concentration of the first element (e.g., a proton) of the semiconductor device 110. The horizontal axis of FIG. 3 is a position pZ along the Z-axis direction. The position pZ corresponds to the depth. The vertical axis is a concentration C1 of the first element (shown logarithmically).

As shown in FIG. 3, the concentration (a first concentration) of the first element at the first position p1 is greater than the concentration (a second concentration) of the first element at the second position p2. The concentration (a third concentration) of the first element at the third position p3 is greater than the first concentration of the first element at the first position p1 and greater than the second concentration of the first element at the second position p2. For example, the third concentration is a maximum of the concentration of the first element in the first insulating member 41.

For example, the first element can function as a positive charge. A high breakdown voltage is obtained by a profile such as that illustrated in FIG. 3. For example, there is a tendency for the breakdown voltage to decrease when the concentration (the second concentration) of the first element at a shallow position (e.g., the second position p2) is high. A high breakdown voltage can be maintained by reducing the concentration (the second concentration) of the first element at the shallow position (e.g., the second position p2). On the other hand, the first-conductivity-type impurity concentration in the first semiconductor region 11 can be set to be high by setting the concentration (the first concentration) of the first element to be high at a deep position (e.g., the first position p1). The on-resistance can be reduced thereby. According to the embodiment, a high breakdown voltage is obtained by reducing the concentration of the first element at a position that is shallower than a deep position.

A low on-resistance is obtained. According to the embodiment, a semiconductor device can be provided in which the characteristics can be improved.

It was found that a higher breakdown voltage is obtained by increasing the concentration of the first element at the third position p3 that is higher than the first position p1. Examples of the relationship between the breakdown voltage and the position of the peak of the first element are described below.

For example, the profile of the first element illustrated in FIG. 3 is obtained by a method such as ion implantation of the first element into a patterning body that includes the semiconductor member 10 and the first insulating member 41, etc. In such a case, the first element may be introduced to a portion of the first semiconductor region 11 of the semiconductor member 10.

For example, as shown in FIG. 1, the first insulating member 41 may include a fourth position p4. The fourth position p4 is between the first electrode 51 and the first position p1 in the first direction (the Z-axis direction). As shown in FIG. 3, the concentration (a fourth concentration) of the first element at the fourth position p4 is less than the concentration (the first concentration) of the first element at the first position p1. The fourth position p4 is, for example, the lower end of the first insulating member 41 (the portion that contacts the second partial region 11b of the first semiconductor region 11).

As shown in FIG. 3, at least a portion of the second partial region 11b of the first semiconductor region 11 may include the first element. The concentration of the first element in at least a portion of the second partial region 11b is less than the concentration (the fourth concentration) of the first element at the fourth position p4.

For example, as shown in FIGS. 2 and 3, the distance along the first direction (the Z-axis direction) between the first position p1 and the third position p3 is taken as a first distance d1. The distance along the first direction between the second partial region 11b and the first conductive member end portion 61a is taken as a distance dz. For example, the distance dz corresponds to the thickness of the first insulating member 41 at the position of the lower end (the first conductive member end portion 61a) of the first conductive member 61.

According to the embodiment, for example, the first distance d1 is greater than 0 times and not more than 3 times the distance dz. The concentration (the third concentration) of the first element at the third position p3 is greater than 1 times and not more than 10 times the concentration (the first concentration) of the first element at the first position p1.

For example, as shown in FIGS. 2 and 3, the distance along the first direction (the Z-axis direction) between the second position p2 and the first conductive member other-end portion 61b is taken as a second distance d2. The second distance d2 is equal to the distance dz (the distance along the first direction between the second partial region 11b and the first conductive member end portion 61a). When such a position is the second position p2, for example, the concentration (the first concentration) of the first element at the first position p1 is not less than 2 times and not more than 100 times the concentration (the second concentration) of the first element at the second position p2.

A high breakdown voltage is obtained by such a profile of the first element. A low on-resistance is obtained.

An example of simulation results of the relationship between the breakdown voltage and the peak position of the concentration of the first element will now be described.

Figure 4A:
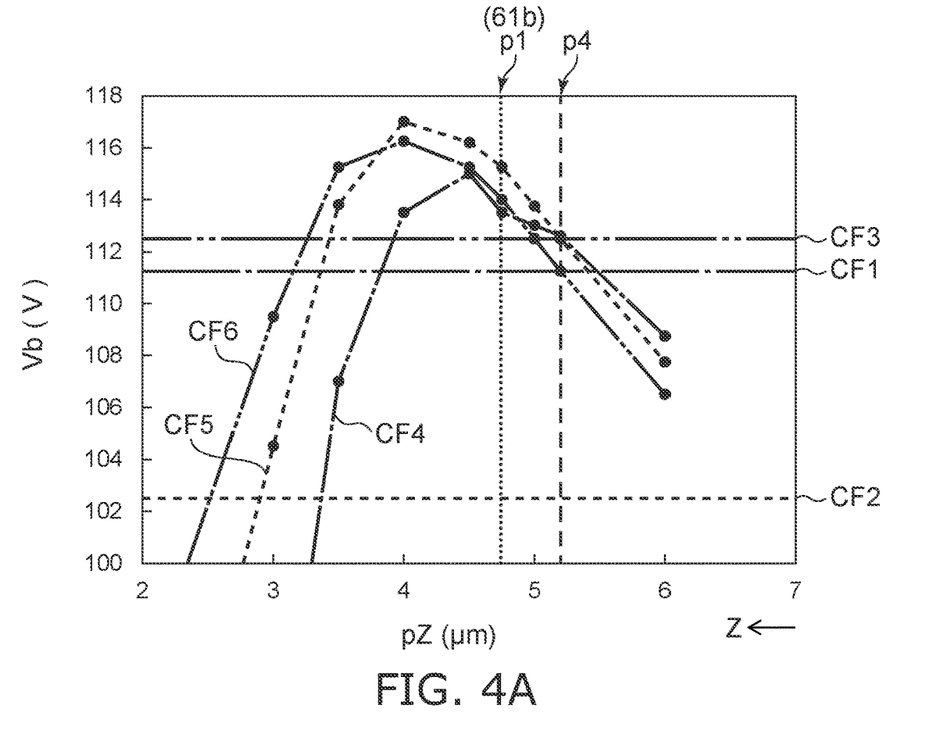
FIGS. 4A and 4B are graphs illustrating characteristics of the semiconductor device.
Figure 4B:
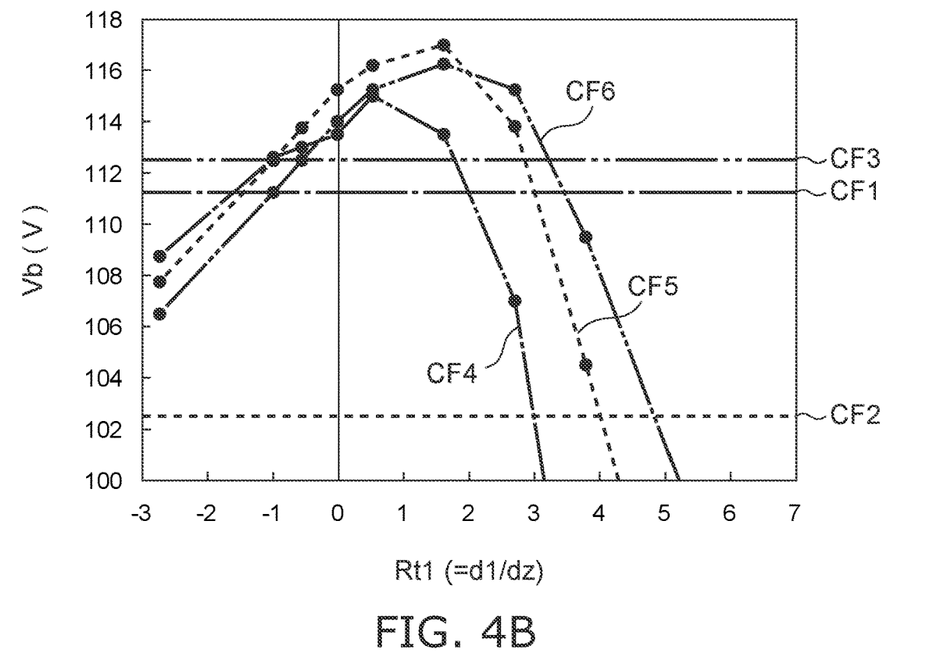

FIGS. 4A and 4B are graphs illustrating characteristics of the semiconductor device.

The horizontal axis of FIG. 4A is the position pZ in the Z-axis direction. A small position pZ corresponds upward in the Z-axis direction in FIG. 1.

The horizontal axis of FIG. 4B is a thickness ratio Rt1. The thickness ratio Rt1 is the ratio (d1/dz) of the first distance d1 to the distance dz. The first distance d1 is the distance along the first direction between the first position p1 and the third position p3. The distance dz is the distance along the first direction between the second partial region 11b and the first conductive member end portion 61a. When the thickness ratio Rt1 is positive, the third position p3 is higher than the first position p1 in FIG. 1. When the thickness ratio Rt1 is negative, the third position p3 is lower than the first position p1 in FIG. 1.

In FIGS. 4A and 4B, the vertical axis is a breakdown voltage Vb. FIGS. 4A and 4B show characteristics of the following first to sixth configurations CF1 to CF6.

In the first to third configurations CF1 to CF3, the concentration of the first element in the first insulating member 41 is constant along the Z-axis direction and is $1.0 \times 10^{16}$ cm$^{-3}$. In the first to third configurations CF1 to CF3, an on-resistance RonA can be controlled by modifying the first-conductivity-type carrier concentration in the first semiconductor region 11. In the first configuration CF1, the first-conductivity-type carrier concentration in the first semiconductor region 11 is set so that the on-resistance RonA is 24 mΩcm$^2$. In the second configuration CF2, the first-conductivity-type carrier concentration in the first semiconductor region 11 is set so that the on-resistance RonA is 25 mΩcm$^2$. In the third configuration CF3, the first-conductivity-type carrier concentration in the first semiconductor region 11 is set so that the on-resistance RonA is 26 mΩcm$^2$.

In the fourth to sixth configurations CF4 to CF6, the concentration of the first element in the first insulating member 41 changes along the Z-axis direction. In other words, the third concentration is greater than the first concentration and greater than the second concentration. The profile of the concentration of the first element has the shape illustrated in FIG. 3. In the fourth to sixth configurations CF4 to CF6, the on-resistance RonA is changed by modifying the third concentration (the maximum concentration) and the position (the depth) in the Z-axis direction of the third position p3 at which the third concentration is obtained.

The first-conductivity-type carrier concentration in the first semiconductor region 11 of the first configuration CF1 is applied to the fourth configuration CF4. In the fourth configuration CF4, the third concentration (the maximum concentration) and the position (the depth) in the Z-axis direction of the third position p3 at which the third concentration is obtained are modified so that the on-resistance RonA is 24 mΩcm$^2$.

The first-conductivity-type carrier concentration in the first semiconductor region 11 of the second configuration CF2 is applied to the fifth configuration CF5. In the fifth configuration CF5, the third concentration (the maximum concentration) and the position (the depth) in the Z-axis direction of the third position p3 at which the third concentration is obtained are modified so that the on-resistance RonA is 25 mΩcm$^2$.

The first-conductivity-type carrier concentration in the first semiconductor region 11 of the third configuration CF3 is applied to the sixth configuration CF6. In the sixth configuration CF6, the third concentration (the maximum concentration) and the position (the depth) in the Z-axis direction of the third position p3 at which the third concentration is obtained are modified so that the on-resistance RonA is 26 mΩcm².

These figures show the breakdown voltage Vb of the first to third configurations CF1 to CF3. The breakdown voltage Vb of the first configuration is about 111.4 V. The breakdown voltage Vb of the second configuration CF2 is about 102.5 V. The breakdown voltage Vb of the third configuration CF3 is about 112.5 V.

As shown in FIG. 4A, in the fourth to sixth configurations CF4 to CF6, a high breakdown voltage Vb is obtained when the position pZ of the third position p3 at which the maximum concentration (the third concentration) is obtained is less (i.e., in FIG. 1, higher than) than the fourth position p4. A high breakdown voltage Vb is obtained when the position pZ of the third position p3 at which the maximum concentration (the third concentration) is obtained is less (i.e., in FIG. 1, higher) than the first position p1.

From FIG. 4A, for example, it is favorable for the first distance d1 along the first direction between the first position p1 and the third position p3 to be greater than 0 μm and not more than 1.2 μm.

In the fourth to sixth configurations CF4 to CF6 as shown in FIG. 4B, a high breakdown voltage Vb is obtained when the thickness ratio Rt1 is positive and is greater than 0 and not more than 3.

Figure 5:
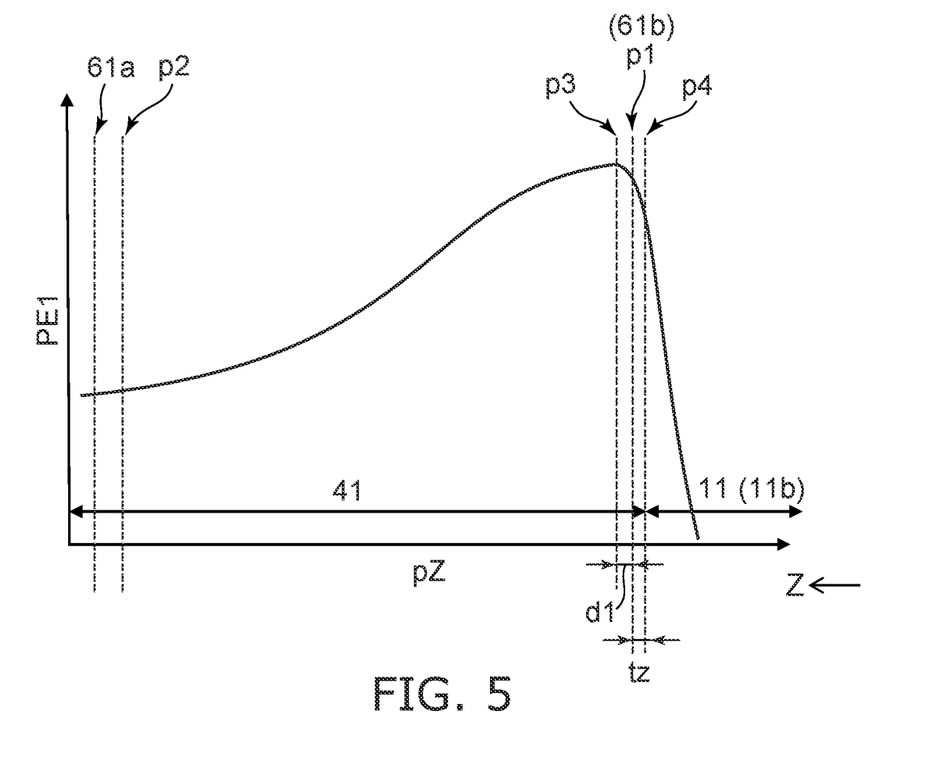
FIG. 5 is a graph illustrating the semiconductor device according to the first embodiment.

FIG. 5 is a graph illustrating the semiconductor device according to the first embodiment.

FIG. 5 illustrates the profile of the potential of the semiconductor device. The horizontal axis of FIG. 5 is the position pZ along the Z-axis direction. The vertical axis is a potential PE1.

As shown in FIG. 5, the potential (the third potential) at the third position p3 is greater than the potential (the first potential) at the first position p1 and greater than the potential (the second potential) at the second position p2. For example, the first potential is greater than the second potential. For example, the potential (the third potential) at the third position p3 is the maximum of the potential of the first insulating member 41.

For example, the first distance d1 along the first direction (the Z-axis direction) between the first position p1 and the third position p3 is greater than 0 times and not more than 3 times the distance dz (the distance along the first direction between the second partial region 11b and the first conductive member end portion 61a (referring to FIG. 2)). For example, the first distance d1 is greater than 0 μm and not more than 1.2 μm.

Second Embodiment

Figure 6:
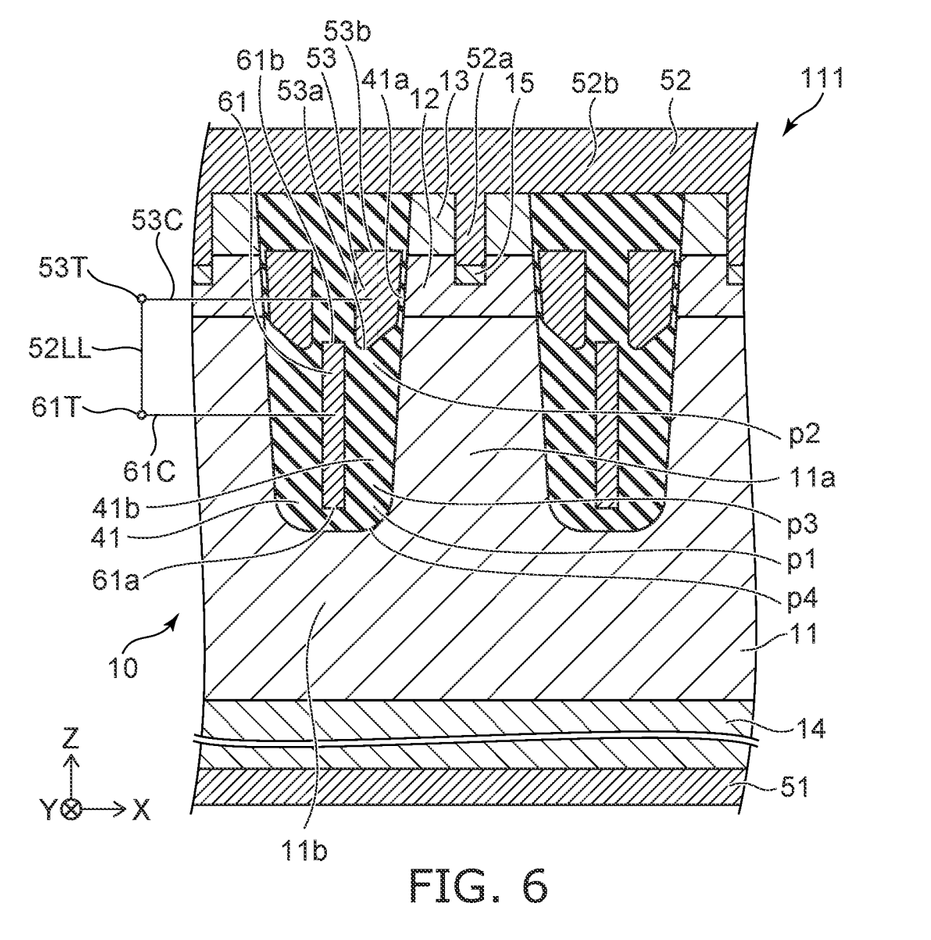
FIG. 6 is a schematic cross-sectional view illustrating a semiconductor device according to a second embodiment.

FIG. 6 is a schematic cross-sectional view illustrating a semiconductor device according to a second embodiment.

As shown in FIG. 6, the semiconductor device 111 according to the embodiment also includes the first electrode 51, the second electrode 52, the third electrode 53, the first conductive member 61, the semiconductor member 10, and the first insulating member 41. In the semiconductor device 111, the first conductive member 61 is electrically connected with the third electrode 53. Or, the first conductive member 61 is electrically connectable with the third electrode 53. Otherwise, the configuration of the semiconductor device 111 may be similar to the configuration of the semiconductor device 110.

As shown in FIG. 6, for example, the first conductive member 61 is electrically connected with the third electrode 53 via the connection member 61C, the connection member 52LL, and a connection member 53C. These connection members may be located at a position that is different from the cross section illustrated in FIG. 6. For example, a terminal 53T may be connected with the third electrode 53 via the connection member 53C. The terminal 61T may be electrically connected with the first conductive member 61 via the connection member 61C. The terminal 61T may be electrically connected with the terminal 53T by the connection member 52LL. The connection member 52LL may be provided separately from the semiconductor device 111.

In the semiconductor device 111 as well, for example, the concentration of the first element in the first insulating member 41 has a profile such as that illustrated in FIG. 3. A high breakdown voltage is obtained thereby. A low on-resistance is obtained.

In the semiconductor device 111 as well, for example, the potential of the first insulating member 41 has a profile such as that illustrated in FIG. 5. A high breakdown voltage is obtained thereby. A low on-resistance is obtained.

According to embodiments described above, it is favorable for the first-conductivity-type carrier concentration in the first semiconductor region 11 to be, for example, not less than $1.0\times10^{15}$ cm$^{-3}$ and not more than $1.0\times10^{17}$ cm$^{-3}$. It is favorable for the second-conductivity-type carrier concentration in the second semiconductor region 12 to be, for example, not less than $1.0\times10^{16}$ cm$^{-3}$ and not more than $1.0\times10^{18}$ cm$^{-3}$. It is favorable for the first-conductivity-type carrier concentration in the third semiconductor region 13 to be, for example, not less than $3.0\times10^{18}$ cm$^{-3}$ and not more than $3.0\times10^{20}$ cm$^{-3}$. It is favorable for the first-conductivity-type carrier concentration in the fourth semiconductor region 14 to be, for example, not less than $1.0\times10^{17}$ cm$^{-3}$ and not more than $3.0\times10^{20}$ cm$^{-3}$. It is favorable for the second-conductivity-type carrier concentration in the fifth semiconductor region 15 to be, for example, not less than $1.0\times10^{18}$ cm$^{-3}$ and not more than $3.0\times10^{20}$ cm$^{-3}$.

According to embodiments described above, for example, the first-conductivity-type impurity concentration in the third semiconductor region 13 is greater than the first-conductivity-type impurity concentration in the first semiconductor region 11. For example, the first-conductivity-type impurity concentration in the fourth semiconductor region 14 is greater than the first-conductivity-type impurity concentration in the first semiconductor region 11. For example, the second-conductivity-type impurity concentration in the fifth semiconductor region 15 is greater than the second-conductivity-type impurity concentration in the second semiconductor region 12.

It is favorable for the first-conductivity-type impurity concentration in the first semiconductor region 11 to be, for example, not less than $1.0\times10^{15}$ cm$^{-3}$ and not more than $1.0\times10^{17}$ cm$^{-3}$. It is favorable for the second-conductivity-type impurity concentration in the second semiconductor region 12 to be, for example, not less than $1.0\times10^{16}$ cm$^{-3}$ and not more than $1.0\times10^{18}$ cm$^{-3}$. It is favorable for the first-conductivity-type impurity concentration in the third semiconductor region 13 to be, for example, not less than $3.0\times10^{18}$ cm$^{-3}$ and not more than $3.0\times10^{20}$ cm$^{-3}$. It is favorable for the first-conductivity-type impurity concentration in the fourth semiconductor region 14 to be, for example, not less than $1.0\times10^{17}$ cm$^{-3}$ and not more than $3.0\times10^{20}$ cm$^{-3}$. It is favorable for the second-conductivity-type impurity concentration in the fifth semiconductor region 15 to be, for example, not less than $1.0\times10^{18}$ cm$^{-3}$ and not more than $3.0\times10^{20}$ cm$^{-3}$.

In embodiments, information that relates to the configurations of the semiconductor regions, etc., is obtained by, for example, electron microscopy, etc. Information that relates to the concentrations of the impurities in the semiconductor regions is obtained by, for example, EDX (Energy Dispersive X-ray Spectroscopy), SIMS (Secondary Ion Mass Spectrometry), etc. Information that relates to the carrier concentrations in the semiconductor regions is obtained by, for example, SCM (Scanning Capacitance Microscopy), etc. The third concentration is, for example, the maximum of the concentration of the first element in the first insulating member 41 on a straight line along the first direction (the Z-axis direction) that passes through the first position p1 and the second position p2. Information that relates to the change of the relative concentration of the first element may be obtained by, for example, photoluminescence analysis, etc. Information that relates to the change of the relative concentration of the first element may be obtained using an electron microscope image.

In embodiments, information that relates to the potential can be obtained by measurements using, for example, SNDP (Scanning nonlinear dielectric potentiometry), EFM (Electrostatic Force Microscope), etc.

According to embodiments, a semiconductor device can be provided in which the characteristics can be improved.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in semiconductor devices such as semiconductor members, semiconductor regions, conductive members, electrodes, insulating members, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all semiconductor devices practicable by an appropriate design modification by one skilled in the art based on the semiconductor devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
a first electrode;
a second electrode, a direction from the first electrode toward the second electrode being along a first direction;
a third electrode;
a first conductive member, the first conductive member including a first conductive member end portion and a first conductive member other-end portion, the first conductive member end portion being between the first electrode and the first conductive member other-end portion in the first direction, a position in the first direction of the first conductive member end portion being between a position in the first direction of the first electrode and a position in the first direction of the third electrode, the first conductive member being electrically connected with the second electrode or being electrically connectable with the second electrode;
a semiconductor member, the semiconductor member including a first semiconductor region of a first conductivity type, a second semiconductor region of a second conductivity type, and a third semiconductor region of the first conductivity type; and
a first insulating member,
the first semiconductor region including a first partial region and a second partial region,
the first partial region being between the first electrode and the second electrode in the first direction,
the second semiconductor region being between the first partial region and the third semiconductor region in the first direction,
the third semiconductor region being electrically connected with the second electrode,
a second direction from a portion of the third electrode toward the second semiconductor region crossing the first direction,
a direction from an other portion of the third electrode toward a portion of the first partial region being along the second direction,
a direction from the second partial region toward the first conductive member being along the first direction,
a direction from the first conductive member toward the first partial region being along the second direction,
at least a portion of the first insulating member being between the semiconductor member and the third electrode and between the semiconductor member and the first conductive member,
at least a portion of the first insulating member including silicon, oxygen, and a first element,
the first element including at least one selected from the group consisting of hydrogen, helium, argon, and carbon,
the first insulating member including a first position, a second position, and a third position,
a direction from the first conductive member end portion toward the first position being along the second direction,
the first position being between the first electrode and the second position in the first direction,
the third position being between the first position and the second position in the first direction,
the entirety of the second position being between the third position and the third electrode in the first direction,
a direction between a portion of the first conductive member toward the first position being along the second direction, a third concentration of the first element at the third position being greater than a first concentration of the first element at the first position and greater than a second concentration of the first element at the second position,
wherein
the third concentration is a maximum of a concentration of the first element in the first insulating member, and
a first distance along the first direction between the first position and the third position is greater than 0 times and not more than 3 times a distance along the first direction between the second partial region and the first conductive member end portion.

2. The device according to claim 1, wherein
the first concentration is greater than the second concentration.

3. The device according to claim 1, wherein
a first distance along the first direction between the first position and the third position is greater than 0 µm and not more than 1.2 µm.

4. The device according to claim 1, wherein
a second distance along the first direction between the second position and the first conductive member other-end portion is equal to a distance along the first direction between the second partial region and the first conductive member end portion, and
the first concentration is not less than 2 times and not more than 108 times the second concentration.

5. The device according to claim 1, wherein
the third concentration is greater than 1 times and not more than 10 times the first concentration.

6. The device according to claim 1, wherein
the first insulating member further includes a fourth position,
the fourth position is between the first electrode and the first position in the first direction, and
a fourth concentration of the first element at the fourth position is less than the first concentration.

7. The device according to claim 6, wherein
at least a portion of the second partial region includes the first element, and
a concentration of the first element in the at least a portion of the second partial region is less than the fourth concentration.

8. A semiconductor device, comprising:
a first electrode;
a second electrode, a direction from the first electrode toward the second electrode being along a first direction;
a third electrode;
a first conductive member, the first conductive member including a first conductive member end portion and a first conductive member other-end portion, the first conductive member end portion being between the first electrode and the first conductive member other-end portion in the first direction, a position in the first direction of the first conductive member end portion being between a position in the first direction of the first electrode and a position in the first direction of the third electrode, the first conductive member being electrically connected with the second electrode or being electrically connectable with the second electrode;
a semiconductor member, the semiconductor member including a first semiconductor region of a first conductivity type, a second semiconductor region of a second conductivity type, and a third semiconductor region of the first conductivity type; and
a first insulating member,
the first semiconductor region including a first partial region and a second partial region,
the first partial region being between the first electrode and the second electrode in the first direction,
the second semiconductor region being between the first partial region and the third semiconductor region in the first direction,
the third semiconductor region being electrically connected with the second electrode,
a second direction from a portion of the third electrode toward the second semiconductor region crossing the first direction,
a direction from an other portion of the third electrode toward a portion of the first partial region being along the second direction,
a direction from the second partial region toward the first conductive member being along the first direction,
a direction from the first conductive member toward the first partial region being along the second direction,
the first insulating member including a first position, a second position, and a third position,
a direction from the first conductive member end portion toward the first position being along the second direction,
the first position being between the first electrode and the second position in the first direction,
the third position being between the first position and the second position in the first direction,
the entirety of the second position being between the third position and the third electrode in the first direction,
a direction between a portion of the first conductive member toward the first position being along the second direction,
a third potential at the third position being greater than a first potential at the first position and greater than a second potential at the second position,
wherein
the third potential is a maximum potential of the first insulating member, and
a first distance along the first direction between the first position and the third position is greater than 0 times and not more than 3 times a distance along the first direction between the second partial region and the first conductive member end portion.

9. The device according to claim 8, wherein
the first potential is greater than the second potential.

10. The device according to claim 8, wherein
a first distance along the first direction between the first position and the third position is greater than 0 µm and not more than 1.2 µm.

11. The device according to claim 1, wherein
an impurity concentration of the first conductivity type in the third semiconductor region is greater than a carrier concentration of the first conductivity type in the first semiconductor region.

12. The device according to claim 1, wherein
the third electrode includes a third electrode end portion and a third electrode other-end portion,
the third electrode end portion is between the first electrode and the third electrode other-end portion in the first direction, and
the position in the first direction of the first conductive member end portion is between the position in the first direction of the first electrode and a position in the first direction of the third electrode end portion.

13. The device according to claim 12, wherein
the position in the first direction of the first conductive member other-end portion is between the position in the first direction of the first electrode and a position in the first direction of the third electrode other-end portion.

14. The device according to claim 12, wherein
the position in the first direction of the first conductive member other-end portion is between the position in the first direction of the third electrode end portion and a position in the first direction of the third electrode other-end portion.

15. The device according to claim 1, wherein
the semiconductor member further includes a fourth semiconductor region of the first conductivity type,
the fourth semiconductor region is located between the first electrode and the first semiconductor region in the first direction, and
the fourth semiconductor region is electrically connected with the first electrode.

16. The device according to claim 1, wherein
the semiconductor member further includes a fifth semiconductor region of the second conductivity type,
the fifth semiconductor region is located between the second semiconductor region and the second electrode, and
a carrier concentration of the second conductivity type in the fifth semiconductor region is greater than a carrier concentration of the second conductivity type in the second semiconductor region.

17. A semiconductor device, comprising:
a first electrode;
a second electrode, a direction from the first electrode toward the second electrode being along a first direction;
a third electrode;
a first conductive member, the first conductive member including a first conductive member end portion and a first conductive member other-end portion, the first conductive member end portion being between the first electrode and the first conductive member other-end portion in the first direction, a position in the first direction of the first conductive member end portion being between a position in the first direction of the first electrode and a position in the first direction of the third electrode, the first conductive member being electrically connected with the second electrode or being electrically connectable with the second electrode;
a semiconductor member, the semiconductor member including a first semiconductor region of a first conductivity type, a second semiconductor region of a second conductivity type, and a third semiconductor region of the first conductivity type; and
a first insulating member,
the first semiconductor region including a first partial region and a second partial region,
the first partial region being between the first electrode and the second electrode in the first direction,
the second semiconductor region being between the first partial region and the third semiconductor region in the first direction,
the third semiconductor region being electrically connected with the second electrode,
a second direction from a portion of the third electrode toward the second semiconductor region crossing the first direction,
a direction from an other portion of the third electrode toward a portion of the first partial region being along the second direction,
a direction from the second partial region toward the first conductive member being along the first direction,
a direction from the first conductive member toward the first partial region being along the second direction,
at least a portion of the first insulating member being between the semiconductor member and the third electrode and between the semiconductor member and the first conductive member,
at least a portion of the first insulating member including silicon, oxygen, and a first element,
the first element including at least one selected from the group consisting of hydrogen, helium, argon, and carbon,
the first insulating member including a first position, a second position, and a third position,
a direction from the first conductive member end portion toward the first position being along the second direction,
the first position being between the first electrode and the second position in the first direction,
the third position being between the first position and the second position in the first direction,
the entirety of the second position being between the third position and the third electrode in the first direction,
a direction between a portion of the first conductive member toward the first position being along the second direction,
a third concentration of the first element at the third position being greater than a first concentration of the first element at the first position and greater than a second concentration of the first element at the second position,
wherein
the third concentration is a maximum of a concentration of the first element in the first insulating member, and
a first distance along the first direction between the first position and the third position is greater than 0 μm and not more than 1.2 μm.

18. A semiconductor device, comprising:
a first electrode;
a second electrode, a direction from the first electrode toward the second electrode being along a first direction;
a third electrode;
a first conductive member, the first conductive member including a first conductive member end portion and a first conductive member other-end portion, the first conductive member end portion being between the first electrode and the first conductive member other-end portion in the first direction, a position in the first direction of the first conductive member end portion being between a position in the first direction of the first electrode and a position in the first direction of the third electrode, the first conductive member being electrically connected with the second electrode or being electrically connectable with the second electrode;
a semiconductor member, the semiconductor member including a first semiconductor region of a first conductivity type, a second semiconductor region of a second conductivity type, and a third semiconductor region of the first conductivity type; and
a first insulating member,
the first semiconductor region including a first partial region and a second partial region, the first partial region being between the first electrode and the second electrode in the first direction, the second semiconductor region being between the first partial region and the third semiconductor region in the first direction, the third semiconductor region being electrically connected with the second electrode, a second direction from a portion of the third electrode toward the second semiconductor region crossing the first direction, a direction from an other portion of the third electrode toward a portion of the first partial region being along the second direction, a direction from the second partial region toward the first conductive member being along the first direction, a direction from the first conductive member toward the first partial region being along the second direction, the first insulating member including a first position, a second position, and a third position, a direction from the first conductive member end portion toward the first position being along the second direction, the first position being between the first electrode and the second position in the first direction, the third position being between the first position and the second position in the first direction, the entirety of the second position being between the third position and the third electrode in the first direction, a direction between a portion of the first conductive member toward the first position being along the second direction, a third potential at the third position being greater than a first potential at the first position and greater than a second potential at the second position, wherein a first distance along the first direction between the first position and the third position is greater than 0 μm and not more than 1.2 μm.

* * * * *